(12) United States Patent
Peng et al.

(10) Patent No.: US 8,981,373 B1
(45) Date of Patent: Mar. 17, 2015

(54) WHITE LED

(71) Applicants: Lung-Han Peng, Taipei (TW); Yao-Te Wang, Taipei (TW); Po-Chun Yeh, Taichung (TW); Po-Ting Lee, New Taipei (TW)

(72) Inventors: Lung-Han Peng, Taipei (TW); Yao-Te Wang, Taipei (TW); Po-Chun Yeh, Taichung (TW); Po-Ting Lee, New Taipei (TW)

(73) Assignee: Opto Tech Corporation, Hsinchu (TW)

( * ) Notice: Subject to any disclaimer, the term of this patent is extended or adjusted under 35 U.S.C. 154(b) by 0 days.

(21) Appl. No.: 14/146,097

(22) Filed: Jan. 2, 2014

(30) Foreign Application Priority Data

Oct. 1, 2013 (TW) .............................. 102135523 A

(51) Int. Cl.
| | |
|---|---|
| *H01L 21/02* | (2006.01) |
| *H01L 33/08* | (2010.01) |
| *H01L 33/28* | (2010.01) |
| *H01L 33/32* | (2010.01) |
| *H01L 33/34* | (2010.01) |

(52) U.S. Cl.
CPC .............. *H01L 33/08* (2013.01); *H01L 33/28* (2013.01); *H01L 33/32* (2013.01); *H01L 33/34* (2013.01)

USPC ........ 257/43; 257/183; 257/98; 257/E33.055; 257/99

(58) Field of Classification Search
USPC ......................... 257/43, 183, 98, E33.055, 99
See application file for complete search history.

(56) References Cited

U.S. PATENT DOCUMENTS

2006/0081873 A1\* 4/2006 Osinsky et al. ................ 257/183

\* cited by examiner

*Primary Examiner* — Cathy N Lam
(74) *Attorney, Agent, or Firm* — WPAT, PC; Justin King

(57) ABSTRACT

A white LED is provided. The white LED includes a P-type layer, a tunneling structure, an N-type layer, an N-type electrode, and a P-type electrode. The tunneling structure is disposed over the P-type layer. The tunneling structure includes a first barrier layer, an active layer and a second barrier layer. The first barrier layer includes a first metal oxide layer. The active layer includes a second metal oxide layer. The second barrier layer includes a third metal oxide layer. The N-type layer is disposed over the tunneling structure. The N-type electrode and the P-type electrode are respectively contacted with the N-type layer and the P-type layer. An energy gap of the second metal oxide layer is lower than an energy gap of the first metal oxide layer and is lower than an energy gap of the third metal oxide layer.

23 Claims, 8 Drawing Sheets

US 8,981,373 B1

WHITE LED

This application claims the benefit of Taiwan Patent Application No. 102135523, filed Oct. 1, 2013, the subject matter of which is incorporated herein by reference.

FIELD OF THE INVENTION

The present invention relates to a white LED, and more particularly to a white LED including a tunneling structure formed by metal oxide layers.

BACKGROUND OF THE INVENTION

Recently, white light emitting diodes (referred to as white LED) are introduced into the market. Since the white LED has the power-saving benefits, the white LED will gradually replace the conventional fluorescent tube.

Generally, the current white LED uses a phosphor to mix yellow light with blue light to produce white light. For example, when the blue light with a peak wavelength in the range between 450 and 470 nm is absorbed by a yellow phosphor YAG:Ce, a light with a peak wavelength in the range between 550 and 560 nm and a radiation wavelength in the range between 450 and 700 nm is generated. Consequently, the blue light and the yellow light are mixed to produce the white light.

FIG. 1 schematically illustrates the spectrum of a white LED that is produced by a conventional blue LED and a YAG phosphor. As shown in FIG. 1, the high-brightness blue LED with a peak wavelength in the range between 445 and 450 nm is used to excite the YAG phosphor. Since the blue color and the yellow color are two complementary colors, the blue light and the yellow light may be mixed to produce the white color. In other words, the conventional blue LED and the YAG phosphor may be combined as a white LED.

Besides, a UV LED with a peak wavelength in the range between 350 and 430 nm may be used to excite an RGB phosphor. Consequently, the UV light and the RGB light are mixed to produce the white color.

SUMMARY OF THE INVENTION

An embodiment of the present invention provides a white LED. The white LED includes a P-type layer, a tunneling structure, an N-type layer, an N-type electrode, and a P-type electrode. The tunneling structure is disposed over the P-type layer. The tunneling structure includes a first barrier layer, an active layer and a second barrier layer. The first barrier layer includes a first metal oxide layer. The active layer includes a second metal oxide layer. The second barrier layer includes a third metal oxide layer. The N-type layer is disposed over the tunneling structure. The N-type electrode is contacted with the N-type layer. The P-type electrode is contacted with the P-type layer. An energy gap of the second metal oxide layer is lower than an energy gap of the first metal oxide layer. The energy gap of the second metal oxide layer is lower than an energy gap of the third metal oxide layer.

Another embodiment of the present invention provides a white LED. The white LED includes a P-type layer, a tunneling structure, an N-type layer, an N-type electrode, and a P-type electrode. The tunneling structure is disposed over the P-type layer. The tunneling structure includes plural metal oxide layers. The N-type layer is disposed over the tunneling structure. The N-type electrode is contacted with the N-type layer. The P-type electrode is contacted with the P-type layer.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a novel white LED. The white LED does not contain any phosphor, but is capable of emitting a white light. Moreover, by changing the structure of a substrate, the peak wavelength of the white light is adjustable. Consequently, the white LED can be controlled to emit a cool white light or a warm white light.

Figure 1:
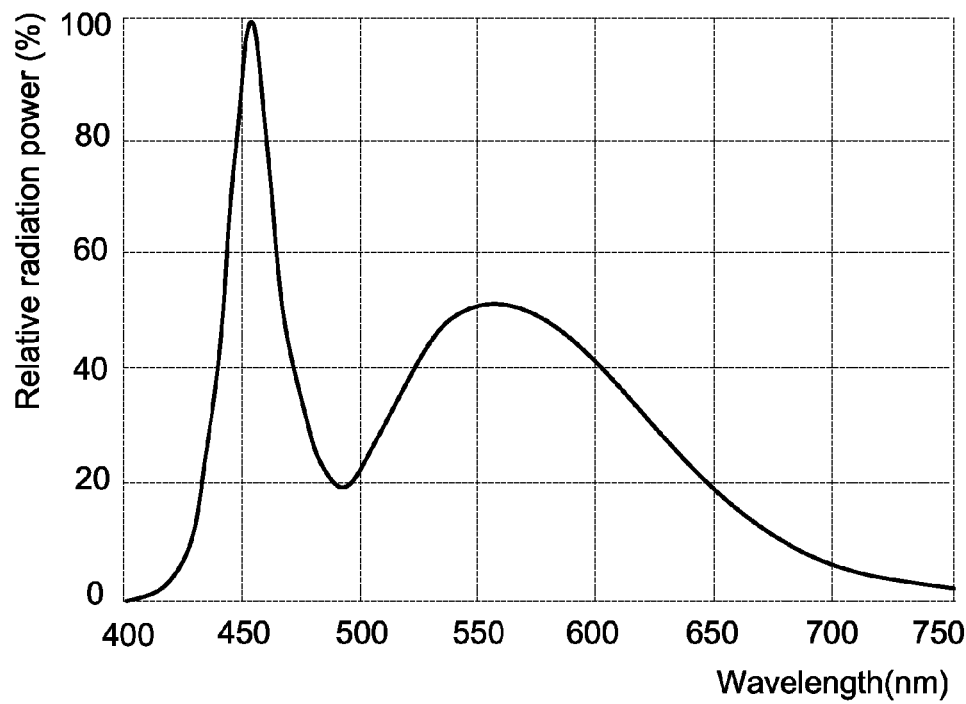
FIG. 1 (prior art) schematically illustrates the spectrum of a white LED that is produced by a conventional blue LED and a YAG phosphor.
Figure 2:
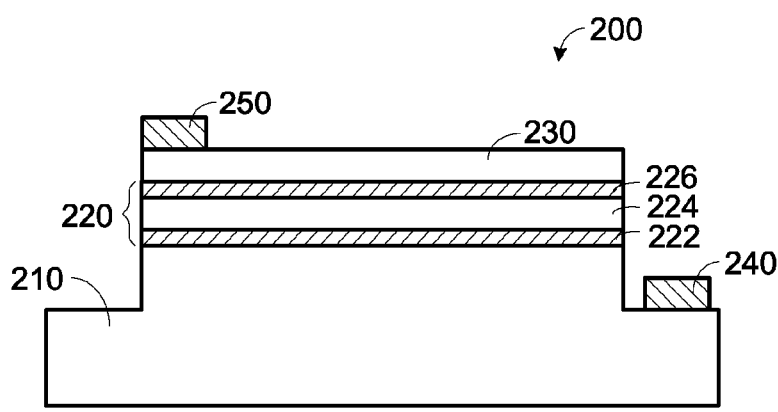
FIG. 2 is a schematic cross-sectional view illustrating a white LED according to an embodiment of the present invention.

FIG. 2 is a schematic cross-sectional view illustrating a white LED according to an embodiment of the present invention. As shown in FIG. 2, the white LED 200 comprises a P-type layer 210, a tunneling structure 220, an N-type layer 230, a P-type electrode 240, and an N-type electrode 250. The P-type layer 210 is a P-type substrate. The tunneling structure 220 of the white LED 200 is a stack structure comprising a first metal oxide layer 222, a second metal oxide layer 224 and a third metal oxide layer 226. The P-type layer 210 is a hole injection layer. The N-type layer 230 is an electron injection layer.

In this embodiment, the first metal oxide layer 222 and the third metal oxide layer 226 of the tunneling structure 220 are made of hafnium oxide ($HFO_2$), and the second metal oxide layer 224 of the tunneling structure 220 is made of zinc oxide (ZnO). Moreover, the energy gap of the second metal oxide layer 224 is lower than the energy gap of the first metal oxide layer 222 and the energy gap of the third metal oxide layer 226. In other words, the first metal oxide layer 222 and the third metal oxide layer 226 are barrier layers, and the second metal oxide layer 224 is an active layer or a well region.

By changing the type of the substrate 210 or the tunneling structure 220, the current-voltage characteristic curve and the spectrum of the white LED 200 of FIG. 2 are correspondingly adjusted. Hereinafter, the current-voltage characteristic curves and the spectra of the white LED 200 in four different conditions will be described in the following four examples (i.e. the first, second, third and fourth examples).

In the first example, the P-type layer 210 of the white LED 200 is a heavily P-type doped (e.g. heavily boron-doped) <111> silicon substrate with electrical resistivity of 0.001 ohm-centimeter, and the N-type layer 230 is an N-type indium tin oxide (ITO) layer. Moreover, the thicknesses of the first metal oxide layer 222, the second metal oxide layer 224 and the third metal oxide layer 226 are 1 nm, 3 nm and 1 nm, respectively.

Figure 3A:
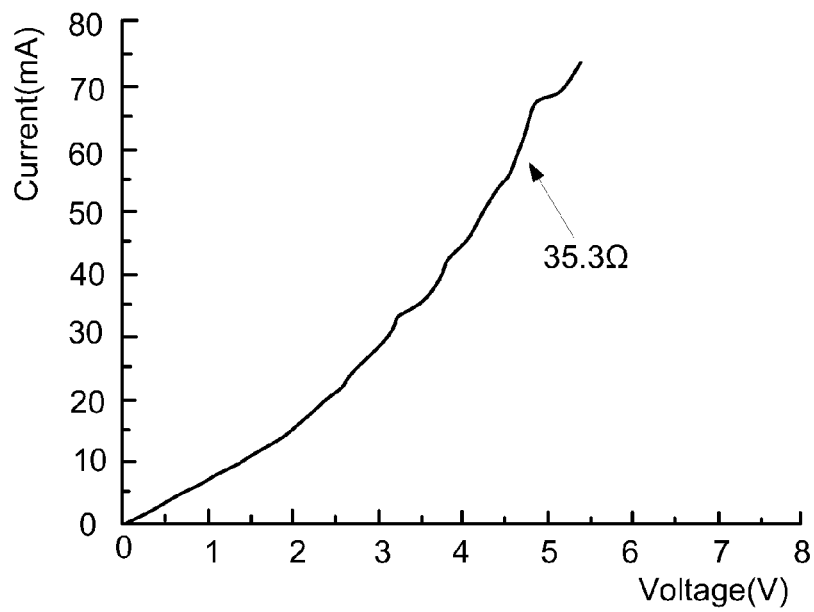
FIG. 3A schematically illustrates a current-voltage characteristic curve of the white LED of the present invention in a first example.
Figure 3B:
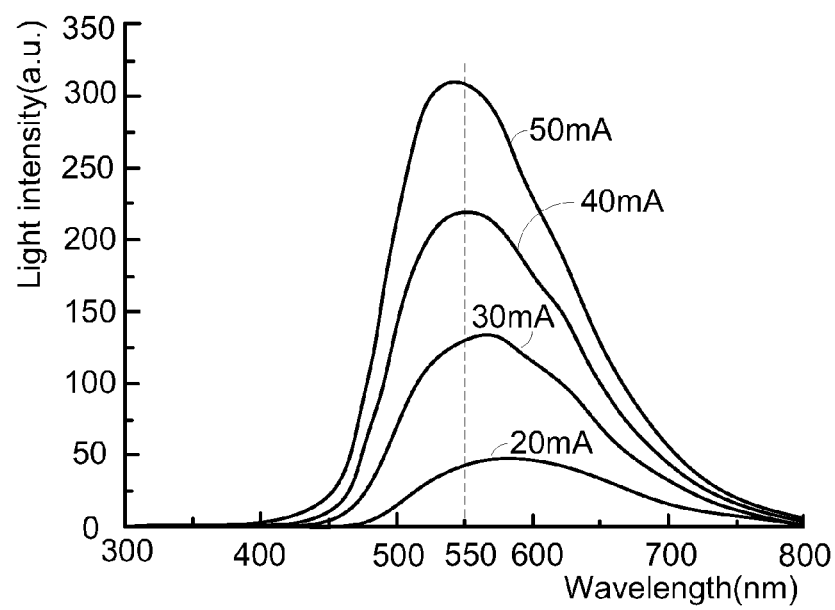
FIG. 3B schematically illustrates a spectrum of the white LED of the present invention in the first example.

FIG. 3A schematically illustrates a current-voltage characteristic curve of the white LED of the present invention in a first example. FIG. 3B schematically illustrates a spectrum of the white LED of the present invention in the first example. During operations of the white LED in the first example, the internal resistance of the white LED is 35.3 ohms. As the magnitude of the driving current flowing through the white LED increases, the light intensity increases. Moreover, since the peak wavelength of the white LED is about 550 nm, the white light is a cool white light. Moreover, the light intensity is indicated by an arbitrary unit (a.u.).

In the second example, the P-type layer 210 of the white LED 200 is a heavily P-type doped (e.g. heavily boron-doped) <111> silicon substrate with electrical resistivity of 0.001 ohm-centimeter, and the N-type layer 230 is an N-type indium tin oxide (ITO) layer. In comparison with the first example, the thicknesses of the first metal oxide layer 222, the second metal oxide layer 224 and the third metal oxide layer 226 of the second example are 2 nm, 6 nm and 2 nm, respectively.

Figure 4A:
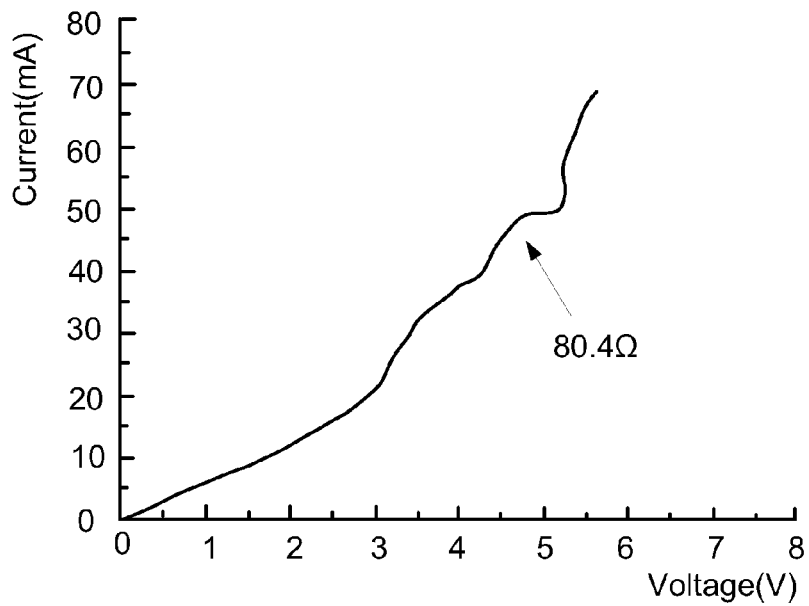
FIG. 4A schematically illustrates a current-voltage characteristic curve of the white LED of the present invention in a second example.
Figure 4B:
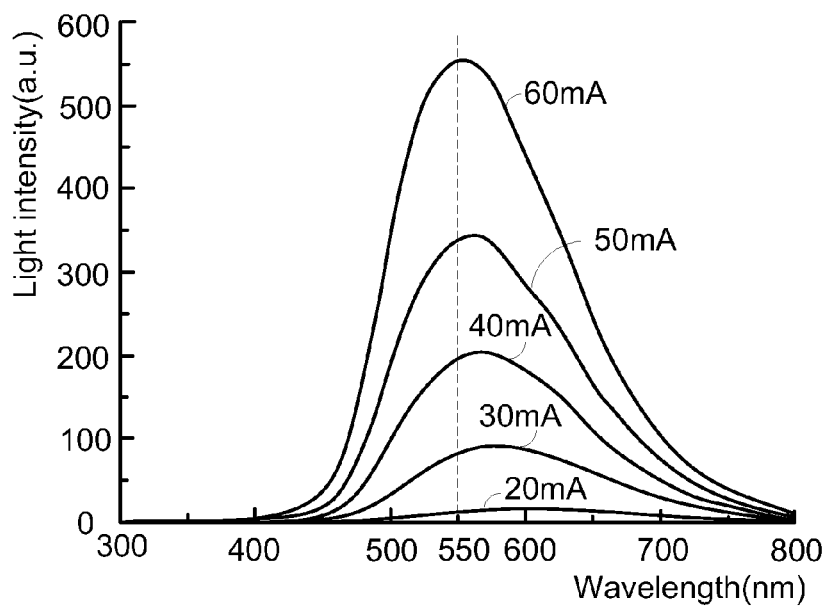
FIG. 4B schematically illustrates a spectrum of the white LED of the present invention in the second example.

FIG. 4A schematically illustrates a current-voltage characteristic curve of the white LED of the present invention in a second example. FIG. 4B schematically illustrates a spectrum of the white LED of the present invention in the second example. During operations of the white LED in the second example, the internal resistance of the white LED is 80.4 ohms. As the magnitude of the driving current flowing through the white LED increases, the light intensity increases. Moreover, since the peak wavelength of the white LED is about 550 nm, the white light is a cool white light.

From the above discussions, since the barrier layer of the tunneling structure 220 of the white LED 200 in the second example is wider than that of the first example, the white LED 200 in the second example has higher internal resistance. After electrons and holes are introduced into the wider well region through the barrier layer, the holes and electrons have higher radiative recombination rate. Since the barrier layer of the tunneling structure 220 of the white LED 200 in the first example is narrower, the internal resistance is lower. After electrons and holes are introduced into the narrower well region through the barrier layer, the holes and electrons have lower radiative recombination rate. Consequently, if the driving current is identical, the white LED 200 in the second example has higher light intensity than the white LED 200 in the first example.

In the third example, the P-type layer 210 of the white LED 200 is a heavily P-type doped (e.g. heavily boron-doped) <100> silicon substrate with electrical resistivity of 5-10 ohm-centimeter, and the N-type layer 230 is an N-type indium tin oxide (ITO) layer. Moreover, the thicknesses of the first metal oxide layer 222, the second metal oxide layer 224 and the third metal oxide layer 226 are 1 nm, 3 nm and 1 nm, respectively. In comparison with the third example, the structure of the P-type layer 210 of the third example is distinguished.

Figure 5A:
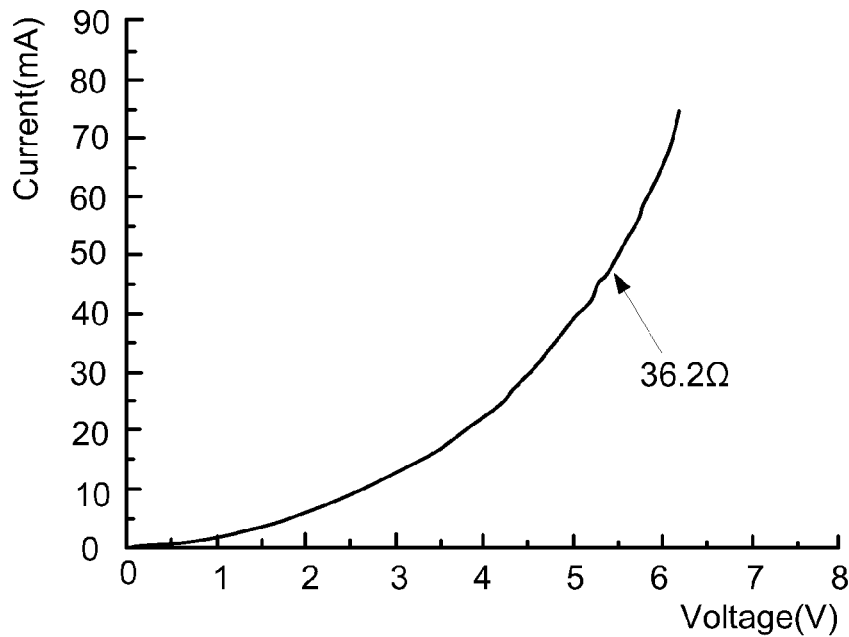
FIG. 5A schematically illustrates a current-voltage characteristic curve of the white LED of the present invention in a third example.
Figure 5B:
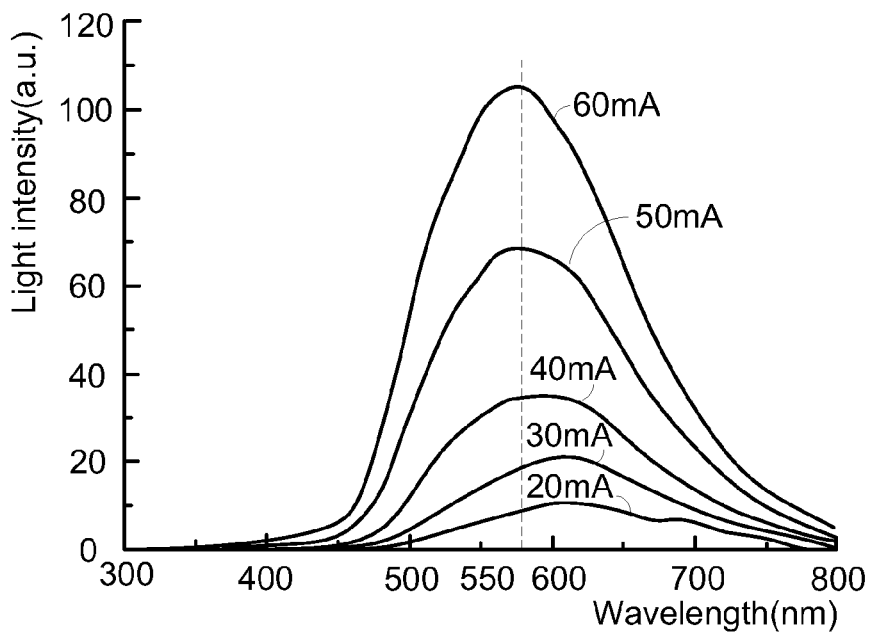
FIG. 5B schematically illustrates a spectrum of the white LED of the present invention in the third example.

FIG. 5A schematically illustrates a current-voltage characteristic curve of the white LED of the present invention in a third example. FIG. 5B schematically illustrates a spectrum of the white LED of the present invention in the third example. During operations of the white LED in the third example, the internal resistance of the white LED is 36.2 ohms. As the magnitude of the driving current flowing through the white LED increases, the light intensity increases. Moreover, since the peak wavelength of the white LED is about 575 nm, the white light is a warm white light.

From the above discussions, the P-type layer 210 of the white LED 200 in the third example is the <100> silicon substrate, and the P-type layer 210 of the white LED 200 in the third example is the <111> silicon substrate. Since the strain of the substrate is different, the arrangement of the radiative recombination density of energy state provided by the metal oxide layers 222, 224 and 226 during the formation of the tunneling structure 200 will be different. Consequently, the peak wavelength of the white light emitted by the white LED 200 in the third example is shifted to 575 nm. In other words, by changing the structure of the substrate, the peak wavelength of the light beam is shifted and the warm white light is emitted.

In the fourth example, the P-type layer 210 of the white LED 200 is a heavily P-type doped (e.g. heavily boron-doped) <100> silicon substrate with electrical resistivity of 5-10 ohm-centimeter, and the N-type layer 230 is an N-type indium tin oxide (ITO) layer. In comparison with the third example, the thicknesses of the first metal oxide layer 222, the second metal oxide layer 224 and the third metal oxide layer 226 of the fourth example are 2 nm, 6 nm and 2 nm, respectively.

Figure 6A:
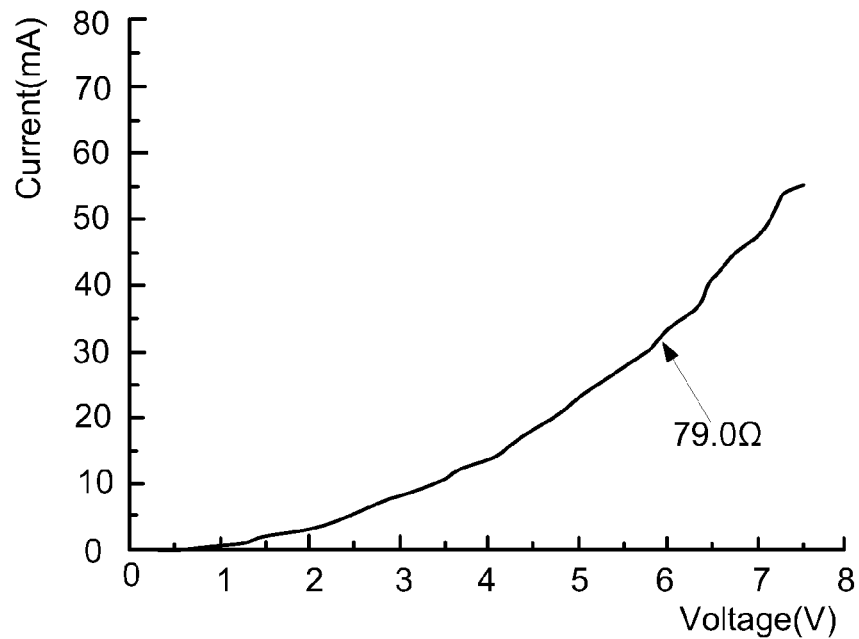
FIG. 6A schematically illustrates a current-voltage characteristic curve of the white LED of the present invention in a fourth example.
Figure 6B:
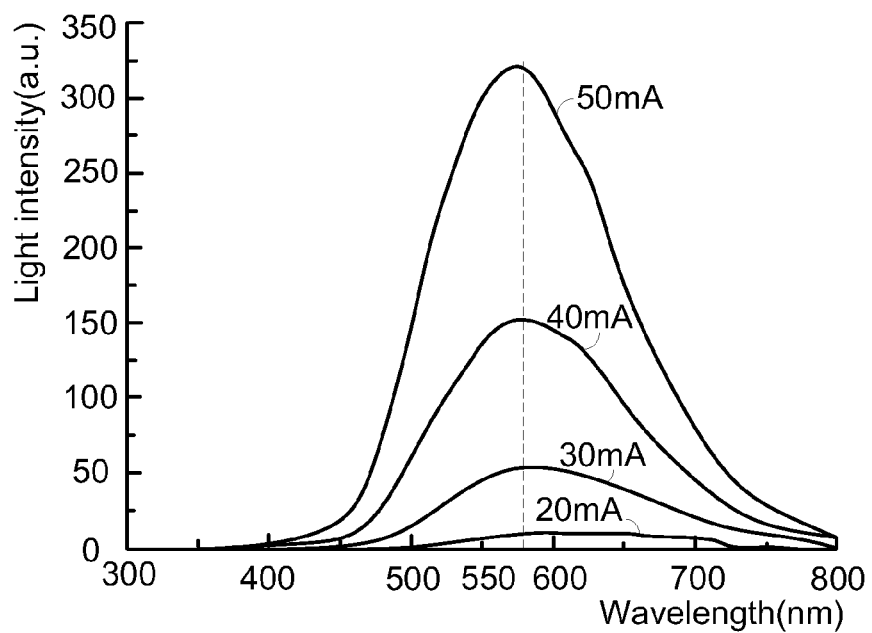
FIG. 6B schematically illustrates a spectrum of the white LED of the present invention in the fourth example.

FIG. 6A schematically illustrates a current-voltage characteristic curve of the white LED of the present invention in a fourth example. FIG. 6B schematically illustrates a spectrum of the white LED of the present invention in the fourth example. During operations of the white LED in the fourth example, the internal resistance of the white LED is 79.0 ohms. As the magnitude of the driving current flowing through the white LED increases, the light intensity increases. Moreover, since the peak wavelength of the white LED is about 575 nm, the white light is a warm white light.

From the above discussions, since the barrier layer of the tunneling structure 220 of the white LED 200 in the fourth example is wider than that of the first example, the white LED 200 in the fourth example has higher internal resistance. After electrons and holes are introduced into the wider well region through the barrier layer, the holes and electrons have higher radiative recombination rate. Since the barrier layer of the tunneling structure 220 of the white LED 200 in the third example is narrower, the internal resistance is lower. After electrons and holes are introduced into the narrower well region through the barrier layer, the holes and electrons have lower radiative recombination rate. Consequently, if the driving current is identical, the white LED 200 in the fourth example has higher light intensity than the white LED 200 in the third example.

In the above examples from the first example to the fourth example, the tunneling structure 220 of the white LED 200 is a stack structure comprising the first metal oxide layer 222, the second metal oxide layer 224 and the third metal oxide layer 226. It is noted that the number of layers of the tunneling structure 220 is not restricted to three. That is, the tunneling structure may be a stack structure comprising more than three layers.

Figure 7:
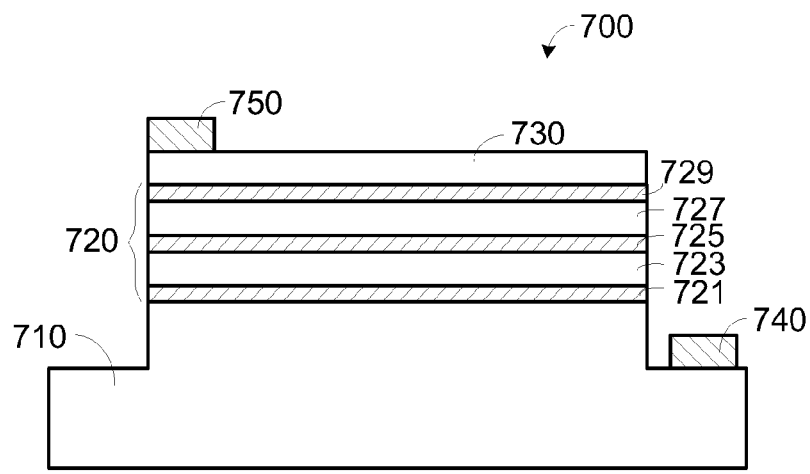
FIG. 7 is a schematic cross-sectional view illustrating a white LED according to another embodiment of the present invention.

FIG. 7 is a schematic cross-sectional view illustrating a white LED according to another embodiment of the present invention. The white LED comprises two active layers or two well regions. As shown in FIG. 7, the white LED 700 comprises a P-type layer 710, a tunneling structure 720, an N-type layer 730, a P-type electrode 740, and an N-type electrode 750. The P-type layer 710 is a P-type substrate. The tunneling structure 720 of the white LED 700 is a stack structure comprising a first metal oxide layer 721, a second metal oxide layer 723, a third metal oxide layer 725, a fourth metal oxide layer 727 and a fifth metal oxide layer 729. The P-type layer 710 is a hole injection layer. The N-type layer 730 is an electron injection layer.

In this embodiment, the first metal oxide layer 721, the third metal oxide layer 723 and the fifth metal oxide layer 729 of the tunneling structure 720 are made of hafnium oxide ($HFO_2$), and the second metal oxide layer 723 and the fourth metal oxide layer 727 of the tunneling structure 720 are made of zinc oxide (ZnO). Moreover, the energy gaps of the second metal oxide layer 723 and the fourth metal oxide layer 727 are lower than the energy gaps of the first metal oxide layer 721, the third metal oxide layer 723 and the fifth metal oxide layer 729. In other words, the first metal oxide layer 721, the third metal oxide layer 723 and the fifth metal oxide layer 729 are barrier layers, and the second metal oxide layer 723 and the fourth metal oxide layer 727 are active layers or well regions.

By changing the type of the substrate 210 or the tunneling structure 220, the current-voltage characteristic curve and the spectrum of the white LED 700 of FIG. 7 are correspondingly adjusted. Hereinafter, the current-voltage characteristic curves and the spectra of the white LED 700 in two different conditions will be described in the following two examples (i.e. the fifth and sixth examples).

In the fifth example, the P-type layer 710 of the white LED 700 is a <111> silicon substrate with electrical resistivity of 0.001-0.005 ohm-centimeter, and the N-type layer 730 is an N-type indium tin oxide (ITO) layer. Moreover, the thicknesses of the first metal oxide layer 721, the second metal oxide layer 723, the third metal oxide layer 725, the fourth metal oxide layer 727 and the fifth metal oxide layer 729 are 2 nm, 6 nm, 2 nm, 6 nm and 2 nm, respectively.

Figure 8:
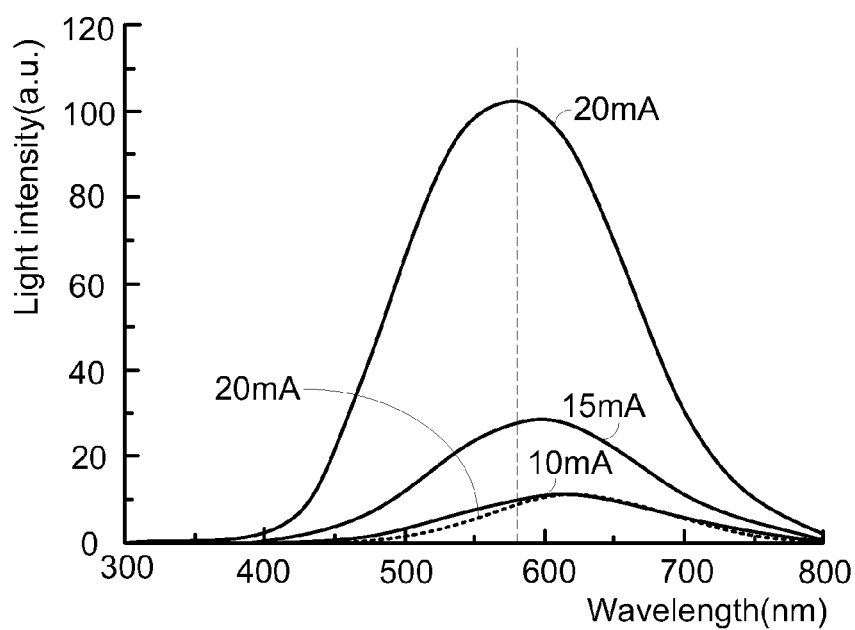
FIG. 8 schematically illustrates a spectrum of the white LED of the present invention in a fifth example.

FIG. 8 schematically illustrates a spectrum of the white LED of the present invention in a fifth example. For comparison, the spectrum of the white LED in the second example (driving current=20 mA) is also shown in FIG. 8 (i.e. the dotted curve).

As the magnitude of the driving current flowing through the white LED increases, the light intensity increases. Moreover, the white LED in the fifth example has a radiation spectrum in the range between 400 nm and 800 nm and a peak wavelength of about 580 nm.

As mentioned above, the thicknesses of the three metal oxide layers of the tunneling structure of the white LED in the second example are 2 nm, 6 nm and 2 nm, respectively. Whereas, the thicknesses of the five metal oxide layers of the tunneling structure of the white LED in the fifth example are 2 nm, 6 nm, 2 nm, 6 nm and 2 nm, respectively. Obviously, if the driving current is identical (e.g. 20 mA), the radiative recombination rate of the white LED in the fifth example (i.e. with two active layers) is about ten times the radiative recombination rate of the white LED in the second example (i.e. with a single active layer).

In the sixth example, the P-type layer 710 of the white LED 700 is a <100> silicon substrate with electrical resistivity of 0.002 ohm-centimeter, and the N-type layer 730 is an N-type indium tin oxide (ITO) layer. Moreover, the thicknesses of the first metal oxide layer 721, the second metal oxide layer 723, the third metal oxide layer 725, the fourth metal oxide layer 727 and the fifth metal oxide layer 729 are 2 nm, 6 nm, 2 nm, 6 nm and 2 nm, respectively.

Figure 9:
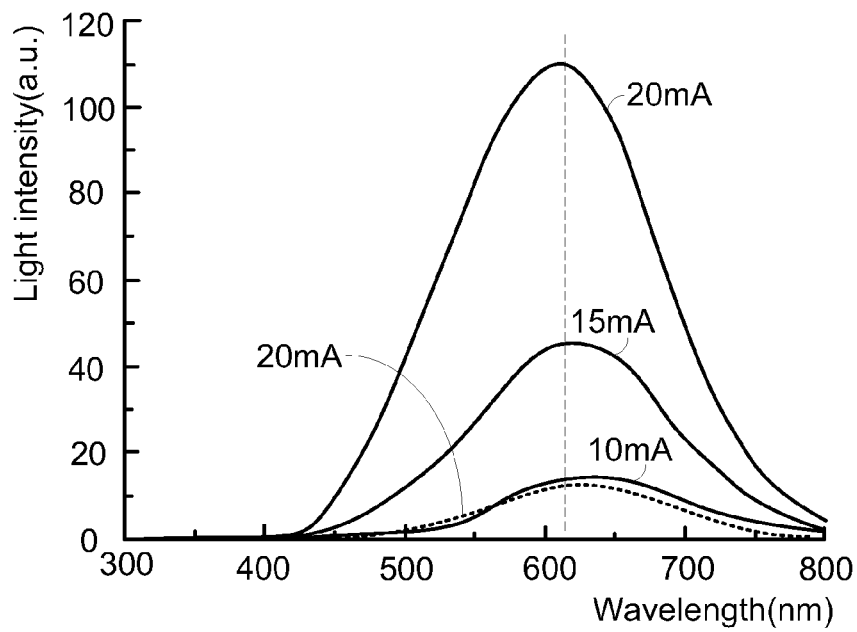
FIG. 9 schematically illustrates a spectrum of the white LED of the present invention in a sixth example.

FIG. 9 schematically illustrates a spectrum of the white LED of the present invention in a sixth example. For comparison, the spectrum of the white LED in the second example (driving current=20 mA) is also shown in FIG. 9 (i.e. the dotted curve).

Similarly, as the magnitude of the driving current flowing through the white LED increases, the light intensity increases. Moreover, the white LED in the sixth example has a radiation spectrum in the range between 420 nm and 820 nm and a peak wavelength of about 610 nm. In comparison with the white LED in the fifth example, the peak wavelength of the white light emitted by the white LED in the sixth example is shifted by 30 nm.

As mentioned above, the thicknesses of the three metal oxide layers of the tunneling structure of the white LED in the fourth example are 2 nm, 6 nm and 2 nm, respectively. Whereas, the thicknesses of the five metal oxide layers of the tunneling structure of the white LED in the sixth example are 2 nm, 6 nm, 2 nm, 6 nm and 2 nm, respectively. Obviously, if the driving current is identical (e.g. 20 mA), the radiative recombination rate of the white LED in the sixth example (i.e. with two active layers) is about ten times the radiative recombination rate of the white LED in the fourth example (i.e. with a single active layer).

In the above examples from the first example to the sixth example, the tunneling structure of the white LED is a stack structure comprising plural metal oxide layers. Especially, the even-numbered metal oxide layers are active layers, and the odd-numbered metal oxide layers are barrier layers. When a bias voltage is applied to the white LED, the white LED generates a driving current. When the holes and electrons are introduced into the active layer (or the well region), the radiative recombination of the holes and electrons generates the white light.

In the above examples from the first example to the sixth example, the barrier layers of the tunneling structure are made of hafnium oxide ($HFO_2$), and the active layers of the tunneling structure are made of zinc oxide (ZnO). It is noted that the materials of the barrier layers and the active layers are not restricted. For example, the active layers may be made of indium gallium zinc oxide (InGaZnO), and the barrier layers may be made of indium gallium hafnium oxide (InGaAlHfO).

Moreover, the plural barrier layers may be made of different materials. For example, in the white LED of FIG. 7, the first metal oxide layer 721, the third metal oxide layer 723 and the fifth metal oxide layer 729 of the tunneling structure 720 may be made of hafnium oxide ($HFO_2$), indium gallium hafnium oxide (InGaAlHfO) and hafnium oxide ($HFO_2$), respectively. Similarly, the plural active layers may be made of different materials. For example, the second metal oxide layer 723 and the fourth metal oxide layer 727 may be made of zinc oxide (ZnO) and indium gallium zinc oxide (InGaZnO), respectively.

In the above examples from the first example to the sixth example, each barrier layer is a single metal oxide layer, and each active layer is a single metal oxide layer. It is noted that the barrier layer or the active layer may be composed of plural metal oxide layers.

Figure 10:
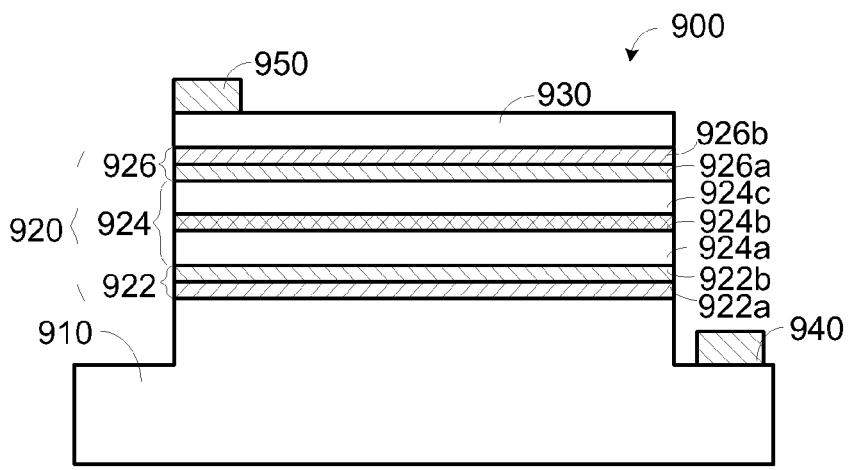
FIG. 10 is a schematic cross-sectional view illustrating a white LED according to another embodiment of the present invention.

FIG. 10 is a schematic cross-sectional view illustrating a white LED according to another embodiment of the present invention. As shown in FIG. 10, the white LED 900 comprises a P-type layer 910, a tunneling structure 920, an N-type layer 930, a P-type electrode 940, and an N-type electrode 950. The P-type layer 910 is a P-type substrate.

In a seventh example, the tunneling structure 920 of the white LED 900 is a stack structure comprising a first barrier layer 922, an active layer 924 and a second barrier layer 926. Moreover, the energy gap of the active layer 924 is lower than the energy gap of the first barrier layer 922 and the energy gap of the second barrier layer 926.

The first barrier layer 922 comprises a first metal oxide layer 922a and a second metal oxide layer 922b. The first metal oxide layer 922a is made of indium gallium hafnium oxide (InGaAlHfO), and the second metal oxide layer 922b is made of hafnium oxide ($HFO_2$).

The active layer 924 comprises a third metal oxide layer 924a, a fourth metal oxide layer 924b and a fifth metal oxide layer 924c. The third metal oxide layer 924a is made of indium gallium zinc oxide (InGaZnO), the fourth metal oxide layer 924b is made of zinc oxide (ZnO), and the fifth metal oxide layer 924c is made of indium gallium zinc oxide (InGaZnO).

The second barrier layer 926 comprises a sixth metal oxide layer 926a and a seventh metal oxide layer 926b. The sixth metal oxide layer 926a is made of hafnium oxide ($HFO_2$), and the seventh metal oxide layer 926b is made of indium gallium hafnium oxide (InGaAlHfO).

From the above discussions, the luminous efficacy of the white LED is adjustable by changing the thickness ratio between the barrier layer and the active layer of the tunneling structure. Moreover, by changing the structure of the substrate where the tunneling structure is grown, the peak wavelength of the white light emitted by the white LED is correspondingly adjusted. Consequently, the white LED may be controlled to emit the cool white light or the warm white light. In other words, the thickness ratio between the barrier layer and the active layer of the tunneling structure is adjustable.

Moreover, by controlling the growing conditions of the metal oxide layers during the formation of the tunneling structure, the arrangement and distribution of the radiative recombination density of energy state provided by the metal oxide layers will be changed. Consequently, the energy band distribution of the conduction band or the valence band of the active layer may be a Gaussian distribution or a Lorentzian distribution. Moreover, please refer to the spectrum of the white LED in the fourth example. When the radiative recombination of the holes and electrons occurs, the full width at half maximum (FWHM) is about 180 nm (470 nm-650 nm). Moreover, the thickness of the tunneling structure of each example is smaller than 20 nm.

In the above embodiments, the P-type layer 210, 710 or 910 is the P-type silicon substrate. Of course, the P-type layer 210, 710 or 910 may be a P-type gallium nitride (P-GaN) layer, a P-type gallium arsenide (P-GaAs) layer or a P-type silicon carbide (P-SiC) layer.

In the above embodiments, the active layer and the N-type layer of the white LED are disposed on the P-type substrate. Alternatively, the active layer and the P-type layer may be disposed on an N-type substrate. That is, after the N-type substrate is used as the N-type layer and the active layer of the tunneling structure and the P-type layer (e.g. a P-type indium tin oxide layer) are sequentially formed on the N-type layer, a white LED is produced.

Figure 11:
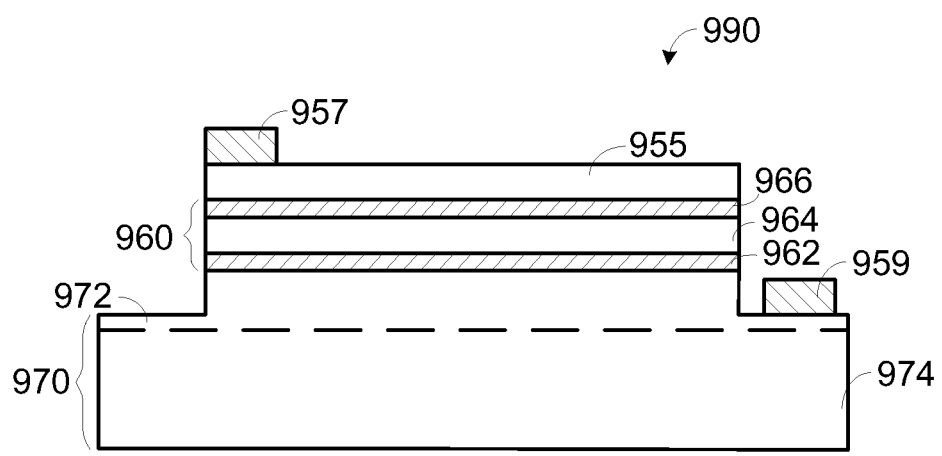
FIG. 11 is a schematic cross-sectional view illustrating a white LED according to another embodiment of the present invention.

FIG. 11 is a schematic cross-sectional view illustrating a white LED according to another embodiment of the present invention. As shown in FIG. 11, the white LED 990 comprises a first type layer 970, a tunneling structure 960, a second type layer 955, a first electrode 959, and a second electrode 957. The first type layer 970 comprises a substrate 974 and a sub layer 972.

In an eighth example, the tunneling structure 960 of the white LED 990 is a stack structure comprising a first barrier layer 962, an active layer 964 and a second barrier layer 966. Moreover, the energy gap of the active layer 964 is lower than the energy gap of the first barrier layer 962 and the energy gap of the second barrier layer 966. The tunneling structure 960 may comprise the above-mentioned metal oxide layers. The materials of the metal oxide layers are not redundantly described herein.

In the eighth example, the first type layer 970 comprises the substrate 974 and the sub layer 972. Moreover, during the process of fabricating the white LED 990, the parts 955, 960 and 972 may be firstly formed on a temporary substrate (not shown). Then, a thin-film lift-off technology is performed to remove the temporary substrate. Then, a permanent substrate 974 is attached on the sub layer 972 (e.g. along the dotted line), and thus the first type layer 970 is formed. In an embodiment, the first type layer is a P-type layer, and the second type layer is an N-type layer. Alternatively, in some other embodiments, the first type layer is an N-type layer, and the second type layer is a P-type layer.

From the above descriptions, the present invention a novel white LED. The tunneling structure of the white LED is a stack structure comprising plural metal oxide layers. Consequently, a white light is emitted in the active layer. Moreover, the white LED may be further packaged into a finished white LED module by any appropriate packaging method (e.g. a flip chip packaging method).

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A white LED, comprising:
   a P-type layer;
   a tunneling structure disposed over the P-type layer, wherein the tunneling structure comprises a first barrier layer, an active layer and a second barrier layer, wherein the first barrier layer comprises a first metal oxide layer, the active layer comprises a second metal oxide layer, and the second barrier layer comprises a third metal oxide layer;
   an N-type layer disposed over the tunneling structure;
   an N-type electrode contacted with the N-type layer; and a P-type electrode contacted with the P-type layer, wherein an energy gap of the second metal oxide layer is lower than an energy gap of the first metal oxide layer, and the energy gap of the second metal oxide layer is lower than an energy gap of the third metal oxide layer.

2. The white LED as claimed in claim 1, wherein the second metal oxide layer is a zinc oxide layer or an indium gallium zinc oxide layer.

3. The white LED as claimed in claim 1, wherein a conduction band or a valence band of the second metal oxide layer has a wide energy band distribution.

4. The white LED as claimed in claim 3, wherein the wide energy band distribution is a Gaussian distribution or a Lorentzian distribution.

5. The white LED as claimed in claim 1, wherein the first metal oxide layer is a hafnium oxide layer or an indium gallium hafnium oxide layer.

6. The white LED as claimed in claim 1, wherein the third metal oxide layer is a hafnium oxide layer or an indium gallium hafnium oxide layer.

7. The white LED as claimed in claim 1, wherein the P-type layer is a first-structure P-type silicon substrate or a second-structure P-type silicon substrate, wherein if the P-type layer is the first-structure P-type silicon substrate, a white light emitted by the white LED has a first peak wavelength, wherein if the P-type layer is the second-structure P-type silicon substrate, the white light emitted by the white LED has a second peak wavelength, wherein the first peak wavelength and the second peak wavelength are different from each other.

8. The white LED as claimed in claim 7, wherein the first-structure P-type silicon substrate is a P-type <111> silicon substrate, and the second-structure P-type silicon substrate is a P-type <100> silicon substrate.

9. The white LED as claimed in claim 1, wherein the P-type layer is a P-type gallium nitride layer, a P-type gallium arsenide layer or a P-type silicon carbide layer.

10. The white LED as claimed in claim 1, wherein the N-type layer is an N-type indium tin oxide layer, and the P-type layer is a P-type silicon substrate.

11. The white LED as claimed in claim 1, wherein the N-type layer is an N-type silicon substrate, and the P-type layer is a P-type indium tin oxide layer.

12. The white LED as claimed in claim 1, wherein the tunneling structure is a stack structure comprising the first metal oxide layer, the second metal oxide layer, the third metal oxide layer, a fourth metal oxide layer and a fifth metal oxide layer, wherein an energy gap of the fourth metal oxide layer is lower than an energy gap of the third metal oxide layer, and the energy gap of the fourth metal oxide layer is lower than an energy gap of the fifth metal oxide layer.

13. The white LED as claimed in claim 12, wherein the fourth metal oxide layer is a zinc oxide layer or an indium gallium zinc oxide layer.

14. The white LED as claimed in claim 12, wherein the fifth metal oxide layer is a hafnium oxide layer or an indium gallium hafnium oxide layer.

15. A white LED, comprising:

a P-type layer;

a tunneling structure disposed over the P-type layer, wherein the tunneling structure comprises plural metal oxide layers;

an N-type layer disposed over the tunneling structure;

an N-type electrode contacted with the N-type layer; and a P-type electrode contacted with the P-type layer.

16. The white LED as claimed in claim 15, wherein the P-type layer is a first-structure P-type silicon substrate or a second-structure P-type silicon substrate, wherein if the P-type layer is the first-structure P-type silicon substrate, a white light emitted by the white LED has a first peak wavelength, wherein if the P-type layer is the second-structure P-type silicon substrate, the white light emitted by the white LED has a second peak wavelength, wherein the first peak wavelength and the second peak wavelength are different from each other.

17. The white LED as claimed in claim 16, wherein the first-structure P-type silicon substrate is a P-type <111> silicon substrate, and the second-structure P-type silicon substrate is a P-type <100> silicon substrate.

18. The white LED as claimed in claim 15, wherein the P-type layer is a P-type gallium nitride layer, a P-type gallium arsenide layer or a P-type silicon carbide layer.

19. The white LED as claimed in claim 15, wherein the N-type layer is an N-type indium tin oxide layer, and the P-type layer is a P-type silicon substrate.

20. The white LED as claimed in claim 15, wherein the N-type layer is an N-type silicon substrate, and the P-type layer is a P-type indium tin oxide layer.

21. The white LED as claimed in claim 15, wherein even-numbered metal oxide layers of the plural metal oxide layers are active layers, and odd-numbered metal oxide layers of the plural metal oxide layers are barrier layers.

22. The white LED as claimed in claim 21, wherein one of the even-numbered metal oxide layers is a zinc oxide layer or an indium gallium zinc oxide layer.

23. The white LED as claimed in claim 21, wherein one of the odd-numbered metal oxide layers is a hafnium oxide layer or an indium gallium hafnium oxide layer.

* * * * *